(12) United States Patent
Ivan et al.

(10) Patent No.: US 10,738,143 B2
(45) Date of Patent: Aug. 11, 2020

(54) RADIATION CURABLE POLYMER FORMULATION AND METHODS FOR THE PREPARATION THEREOF

(71) Applicant: NATIONAL RESEARCH COUNCIL OF CANADA, Ottawa (CA)

(72) Inventors: Marius G. Ivan, Ottawa (CA); Yanguang Zhang, Ottawa (CA)

(73) Assignee: National Research Council of Canada, Ottawa, Ontario (CA)

( * ) Notice: Subject to any disclaimer, the term of this patent is extended or adjusted under 35 U.S.C. 154(b) by 354 days.

(21) Appl. No.: 15/235,831

(22) Filed: Aug. 12, 2016

(65) Prior Publication Data

US 2017/0044289 A1 Feb. 16, 2017

Related U.S. Application Data

(60) Provisional application No. 62/204,724, filed on Aug. 13, 2015.

(51) Int. Cl.
| | | |
|---|---|---|
| *C08F 222/20* | (2006.01) | |
| *C08F 220/18* | (2006.01) | |
| *C09D 133/14* | (2006.01) | |
| *C09D 133/08* | (2006.01) | |
| *H01L 21/02* | (2006.01) | |
| *C09D 4/00* | (2006.01) | |
| *H01L 51/00* | (2006.01) | |
| *H01L 51/05* | (2006.01) | |

(52) U.S. Cl.
CPC .......... *C08F 222/20* (2013.01); *C08F 220/18* (2013.01); *C09D 4/00* (2013.01); *C09D 133/08* (2013.01); *C09D 133/14* (2013.01); *H01L 21/02118* (2013.01); *H01L 21/02288* (2013.01); *H01L 21/02348* (2013.01); *H01L 51/0027* (2013.01); *C08F 220/1804* (2020.02); *H01L 51/052* (2013.01)

(58) Field of Classification Search
CPC .................. C08F 222/20; C08F 222/18; C08F 222/1804; C09D 133/14; C09D 133/08; C09D 4/00; H01L 21/02118; H01L 21/02238; H01L 21/02348; H01L 61/0027; H01L 11/052
See application file for complete search history.

(56) References Cited

U.S. PATENT DOCUMENTS

| | | |
|---|---|---|
| 4,490,774 A | 12/1984 | Olson et al. |
| 4,499,520 A | 2/1985 | Cichanowski |
| (Continued) | | |

FOREIGN PATENT DOCUMENTS

| | | |
|---|---|---|
| JP | H05140235 | 6/1993 |
| JP | 2000208358 | 7/2000 |

OTHER PUBLICATIONS

S.C. Tadolini, "Evaluation of Ultrasonic Measurement Systems for Bolt Load Determinations", Bureau of Mines, United States Department of the Interior, Denver, CO, 1990.

(Continued)

*Primary Examiner* — Sanza L. McClendon
(74) *Attorney, Agent, or Firm* — Kenneth Murphy

(57) ABSTRACT

Disclosed is a radiation curable polymer formulation and methods of producing a dielectric film having such a formulation. The radiation curable polymer formulation includes an acrylic monomer; a cross linking agent; and a photoinitiator. The polymer formulation is insoluble with an organic solvent, which is preferable in low cost high volume manufacturing of thin film transistors for flexible electronics.

19 Claims, 8 Drawing Sheets

(56) References Cited

U.S. PATENT DOCUMENTS

| | | | |
|---|---|---|---|
| 6,021,338 A * | 2/2000 | Zahora | C08F 290/067 |
| | | | 174/110 SR |
| 6,184,324 B1 | 2/2001 | Benz et al. | |
| 6,355,599 B1 * | 3/2002 | Zahora | C08F 290/067 |
| | | | 174/125.1 |
| 7,975,555 B2 | 7/2011 | Zhuang et al. | |
| 8,173,225 B2 * | 5/2012 | Kim | B82Y 10/00 |
| | | | 427/271 |
| 8,545,983 B2 | 10/2013 | Jiang et al. | |
| 8,743,451 B2 | 6/2014 | Farrand et al. | |
| 2008/0105059 A1 | 5/2008 | Turnbull et al. | |
| 2008/0131617 A1 * | 6/2008 | Kim | B82Y 10/00 |
| | | | 427/508 |
| 2011/0098942 A1 | 4/2011 | Turner | |
| 2013/0054156 A1 | 2/2013 | Hyett | |

OTHER PUBLICATIONS

M. Hirao et al., "Contacless measurement of bolt axial stress using a shear wave electromagnetic acoustic transducer", NDT&E International, vol. 34, p. 179-183, 2001.

D.W. Greve et al., "An inductively coupled lamb wave transducer", IEEE Sensors Journal, vol. 27, No. 2, p. 295-301, 2007.

P. Zheng et al., "Crack detection with wireless inductively coupled transducers", in Proceedings of SPIE, San Diego, California, USA, 2008.

* cited by examiner

RADIATION CURABLE POLYMER FORMULATION AND METHODS FOR THE PREPARATION THEREOF

CROSS-REFERENCE TO RELATED APPLICATIONS

This application claims the benefit of U.S. Provisional Patent Application Ser. No. 62/204,724 filed Aug. 13, 2015, the entire contents of which is herein incorporated by reference.

FIELD OF THE INVENTION

The present invention relates to polymers used in the production of thin film transistors. More specifically, the present invention relates to radiation curable polymer formulations that when cured have high dielectric constants and methods for the preparation of the same.

BACKGROUND OF THE INVENTION

Thin film transistors for flexible electronics require low cost high volume manufacturing technologies and materials compatible with roll-to-roll printing. However, many commercially available dielectrics used in fabrication of printable electronics are not ideal for such a purpose.

For example, inorganic dielectrics, such as $Al_2O_3$ and other oxides currently used in the flexible electronics industry, need to be deposited in vacuum by either physical vapour deposition or atomic layer deposition. Both processes are not compatible with low cost, high speed roll-to-roll manufacturing of flexible electronics, because after deposition of the inorganic dielectric, a patterning step, such as lithography, has to be performed, which adds complexity and cost to the overall process.

As for commercially available organic dielectrics suitable for the manufacture of thin film transistors, these are usually processed at high temperatures (>120° C.), which presents a problem, since flexible electronics require processing at relatively low temperatures (i.e. room temperature) because some of the materials cannot withstand high processing temperatures. For example, higher temperatures often cause deformations and misalignments in the thin film transistor stack.

Moreover, most polymer dielectrics are not compatible with certain solvents used in the production of flexible electronics. For example, polymethyl methacrylate (PMMA) is often used as a dielectric. However, PMMA has the disadvantage of being soluble in many organic solvents used during processing, which limits the choices of inks and materials that may be used during processing. In addition, PMMA has a relatively low dielectric constant (<3.8).

One possible route to obtain polymer dielectrics insoluble in organic solvents is to cross-link the polymer chains. While some commercially available cross-linkable dielectrics require high baking temperatures, >120° C., the ideal formulation would be processable at room temperature and under open air. In photoinduced free radical polymerization and cross-linking, the reactions occur at room temperature. Generally free radical polymerizations and crosslinking reactions are carried out in the absence of oxygen, which is a known inhibitor. This may be accomplished by removing oxygen from the solution of acrylates, and then performing the polymerization under an inert gas atmosphere. However, these steps are cumbersome and difficult to do in a roll-to-roll printing line.

From the above-description it is clear that there is an opportunity to develop polymer formulations that are more conducive to use in roll-to-roll printing applications, and which may be photopolymerized and cross-linked under open air at room temperature.

SUMMARY OF THE INVENTION

According to an aspect of the present invention, there is provided a radiation curable polymer formulation. The formulation having: an acrylic monomer, a cross-linking agent, and a photoinitiator. The polymerized and crosslinked (i.e. cured) formulation is insoluble in an organic solvent, such as isopropanol, acetone, ethanol, methanol or combinations thereof.

In an embodiment, the cured formulation is also insoluble in an aqueous solvent.

In an embodiment, the radiation cured polymer formulation has a dielectric constant greater than 3.8.

In another embodiment, the acrylic monomer is isobutyl acrylate, tert-butyl acrylate, butyl acrylate, butyl methacrylate, isobornyl acrylate, hexyl acrylate, 2-ethylhexyl acrylate or 2-hydroxyethyl acrylate.

In yet another embodiment, the cross linking agent is glycerol 1,3-diglycerolate diacrylate (GDGDA), 1,6-hexanediol diacrylate, 1,6-hexanediol dimethacrylate, trimethylolpropane triacrylate, pentaerythritol triacrylate, pentaerythritol tetraacrylate, di(trimethylolpropane) tetraacrylate or trimethylolpropane propoxylate triacrylate.

In a further embodiment, the photoinitiator is 4,4'-bis(dimethylamino)benzophenone (also known as Michler's ketone) or 9,10-phenanthrenequinone.

In a still further embodiment, the acrylic monomer is isobutyl acrylate; the cross linking agent is glycerol 1,3-diglycerolate diacrylate, trimethylolpropane triacrylate, pentaerythritol triacrylate, pentaerythritol tetraacrylate or di(trimethylolpropane) tetraacrylate; and the photoinitiator is 4,4'-bis(dimethylamino)benzophenone, provided at a concentration of about 1 to about 3% weight relative to the acrylates mass.

According to an aspect of the present invention, there is provided a radiation curable polymer comprising about 1 to about 99% (w/w) glycerol 1,3-diglycerolate diacrylate, about 99% to about 1% (w/w) isobutyl acrylate and about 0.1% to about 20% weight relative to acrylates mass of 4,4'-bis(dimethylamino)benzophenone.

In one embodiment, the formulation comprises about 80:20 weight ratio glycerol 1,3-diglycerolate diacrylate to isobutyl acrylate and about 1% weight relative to acrylates mass of 4,4'-bis(dimethylamino)benzophenone.

In a second embodiment, the formulation comprises about 20:80 weight ratio glycerol 1,3-diglycerolate diacrylate to isobutyl acrylate and about 1% weight relative to acrylates mass of 4,4'-bis(dimethylamino)benzophenone.

In a third embodiment, the formulation comprises about 50:50 weight ratio glycerol 1,3-diglycerolate diacrylate to isobutyl acrylate and about 1% weight relative to acrylates mass of 4,4'-bis(dimethylamino)benzophenone.

In a fourth embodiment, the formulation comprises about 80:20 weight ratio glycerol 1,3-diglycerolate diacrylate to isobutyl acrylate and about 3% weight relative to acrylates mass of 4,4'-bis(dimethylamino)benzophenone.

According to an aspect of the present invention, there is provided a radiation curable polymer comprising about 1 to about 99% (w/w) glycerol 1,3-diglycerolate diacrylate, about 99% to about 1% (w/w) isobutyl acrylate and about 0.1% to about 20% weight relative to acrylates mass of 9,10-phenanthrenequinone. An exemplary formulation comprises about 50:50 weight ratio glycerol 1,3-diglycerolate diacrylate to isobutyl acrylate and about 1% weight relative to acrylates mass of 9,10-phenanthrenequinone.

According to an aspect of the present invention, there is provided a radiation curable polymer comprising about 1 to about 99% (w/w) trimethylolpropane triacrylate, about 99% to about 1% (w/w) isobutyl acrylate and about 0.1% to about 20% weight relative to acrylates mass of 4,4'-bis(dimethylamino)benzophenone. An exemplary formulation comprises about 20:80 weight ratio trimethylolpropane triacrylate to isobutyl acrylate and about 3% weight relative to acrylates mass of 4,4'-bis(dimethylamino)benzophenone.

According to an aspect of the present invention, there is provided a radiation curable polymer comprising about 1 to about 99% (w/w) pentaerythritol tetraacrylate, about 99% to about 1% (w/w) isobutyl acrylate and about 0.1% to about 20% weight relative to acrylates mass of 4,4'-bis(dimethylamino)benzophenone. An exemplary formulation comprises about 20:80 weight ratio pentaerythritol tetraacrylate to isobutyl acrylate and about 3% weight relative to acrylates mass of 4,4'-bis(dimethylamino)benzophenone.

According to an aspect of the present invention, there is provided a radiation curable polymer comprising about 1 to about 99% (w/w) di(trimethylolpropane) tetraacrylate, about 99% to about 1% (w/w) isobutyl acrylate and about 0.1% to about 20% weight relative to acrylates mass of 4,4'-bis(dimethylamino)benzophenone. An exemplary formulation comprises about 20:80 weight ratio di(trimethylolpropane) tetraacrylate to isobutyl acrylate and about 3% weight relative to acrylates mass of 4,4'-bis(dimethylamino)benzophenone.

According to an aspect of the present invention, there is provided a radiation curable polymer comprising about 1 to about 99% (w/w) pentaerythritol triacrylate, about 99% to about 1% (w/w) isobutyl acrylate and about 0.1% to about 20% weight relative to acrylates mass of 4,4'-bis(dimethylamino)benzophenone. An exemplary formulation comprises about 20:80 weight ratio pentaerythritol triacrylate to isobutyl acrylate and about 3% weight relative to acrylates mass of 4,4'-bis(dimethylamino)benzophenone.

According to an aspect of the present invention, the above-described formulations are cured to form a polymer.

According to an aspect of the present invention, there is provided a method for producing a dielectric film. The method involves: preparing a polymer formulation comprising an acrylic monomer, a cross linking agent, and a photoinitiator; applying the polymer formulation to a substrate; and curing the polymer formulation by exposing the coated substrate to UV radiation in an open air atmosphere.

In one embodiment, the polymer formulation is the radiation curable polymer' formulation as described above.

In another embodiment, the step of applying involves spin coating the polymer formulation to the substrate, such as a flexible or rigid substrate.

In another embodiment, the step of applying involves printing the polymer formulation on the substrate. Printing includes, for example, screen printing, inkjet printing, flexography printing (e.g. stamps, roll-to-roll), gravure printing, off-set printing, airbrushing, aerosol printing and typesetting. By adjusting the viscosity of the polymer formulation appropriately, the polymer formulation may be used in any of these printing methods, or in any other deposition method.

According to another aspect of the present invention, there is provided a thin film transistor produced by the method described above.

According to a further aspect of the present invention, there is provided a thin film transistor that has the radiation curable polymer formulation described above. In another embodiment, the formulation is cured.

Further features will be described or will become apparent in the course of the following detailed description. It should be understood that each feature described herein may be utilized in any combination with any one or more of the other described features, and that each feature does not necessarily rely on the presence of another feature except where evident to one of skill in the art.

BRIEF DESCRIPTION OF THE DRAWINGS

These and other features, aspects and advantages of the present invention will become better understood with regard to the following description and accompanying drawings wherein.

DETAILED DESCRIPTION OF THE INVENTION

Figure 1:
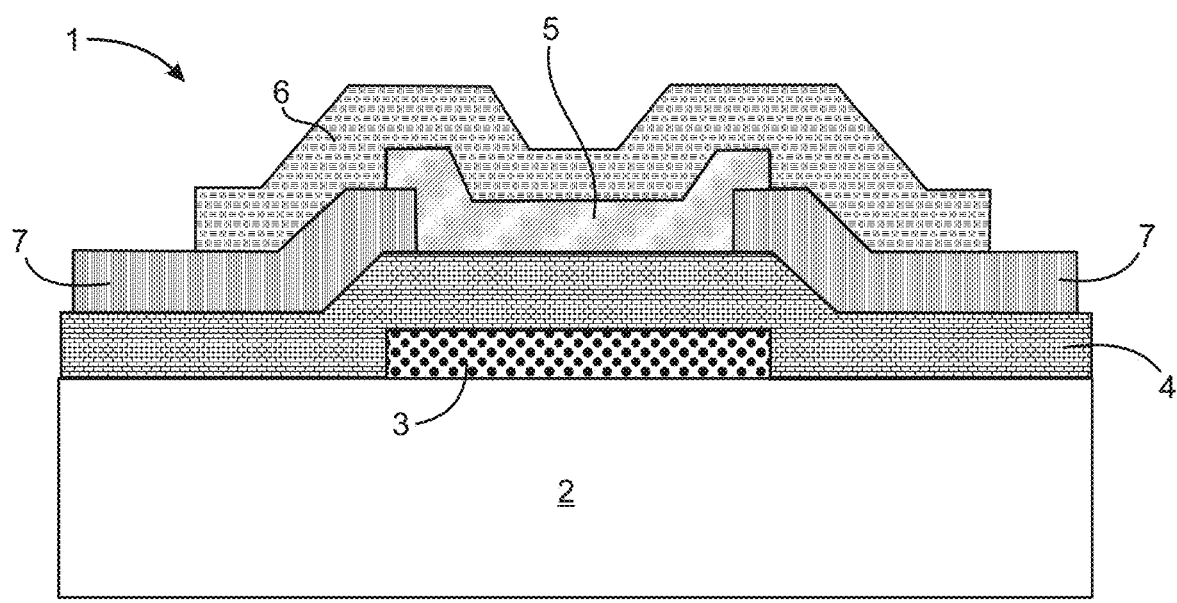
FIG. 1 is a diagrammatical representation of a transistor according to an embodiment of the present invention.
Figure 2:
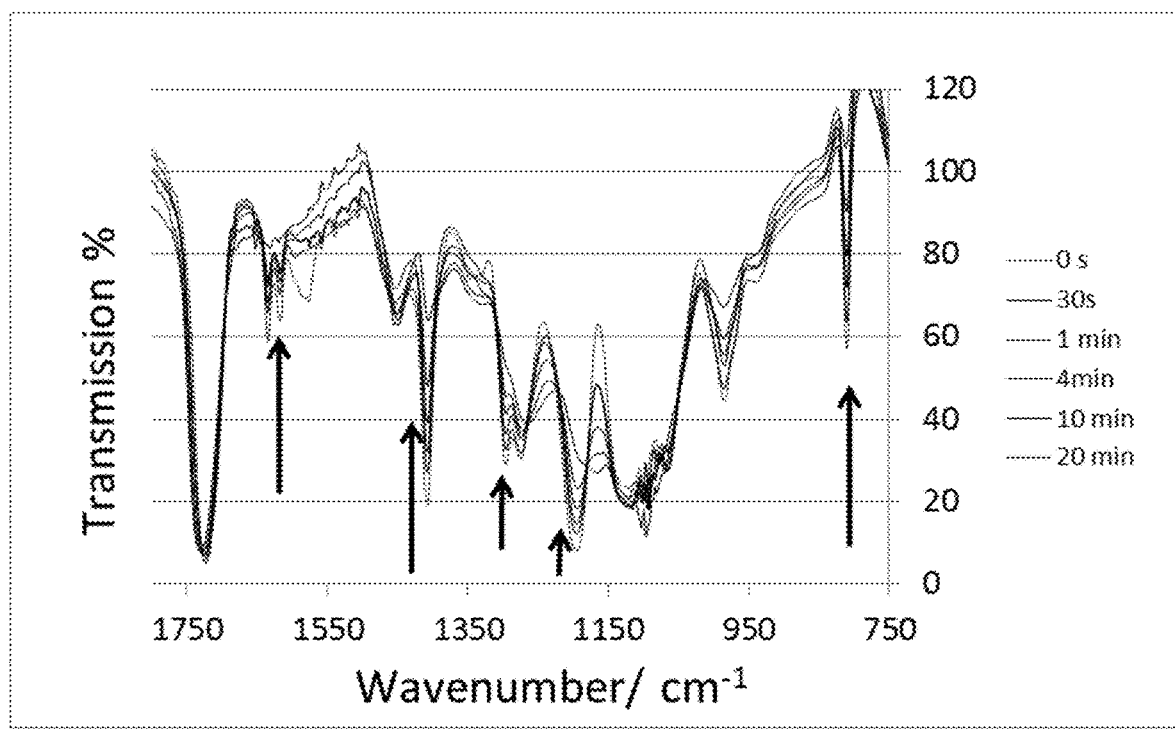
FIG. 2 is a graphical representation of a FTIR spectra of UV cured acrylate films (containing about 80:20 weight ratio glycerol 1,3-diglycerolate diacrylate to isobutyl acrylate and 4,4'-bis(dimethylamino)benzophenone about 1% weight relative to the mass of acrylates), exposed at 365 nm for increasing time periods: 0 s, 30 s, 1, 4, 10, and 20 minutes respectively.
Figure 3:
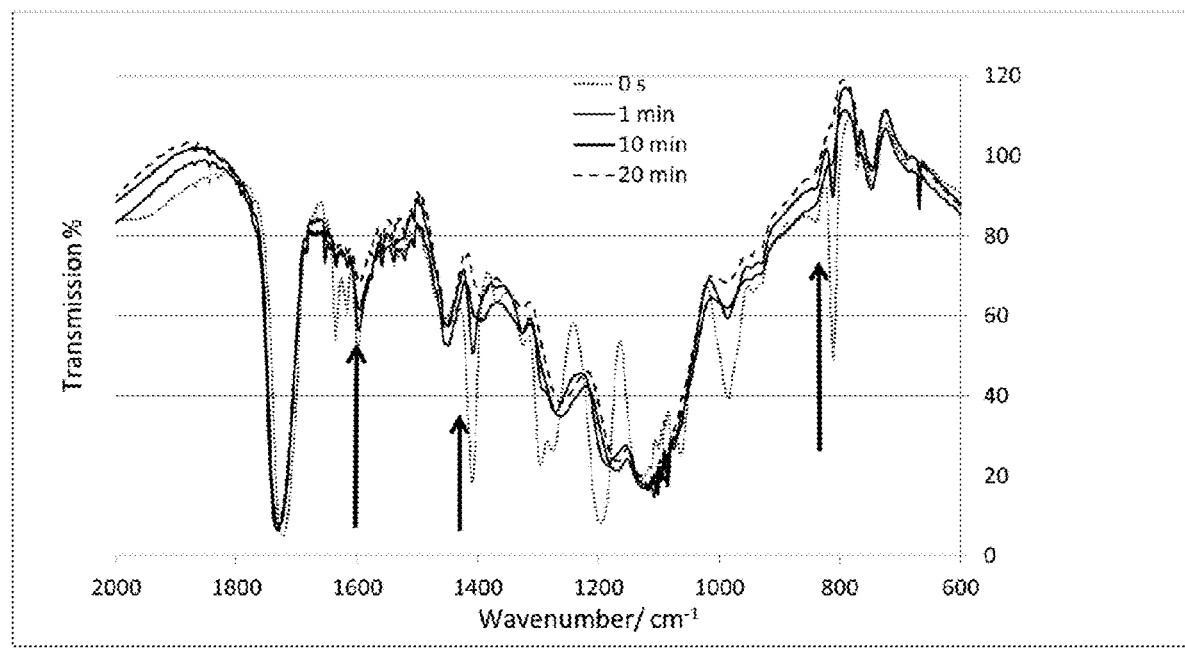
FIG. 3 is a graphical representation of a FTIR spectra of UV cured acrylate films (containing about 80:20 weight ratio glycerol 1,3-diglycerolate diacrylate to isobutyl acrylate and 4,4'-bis(dimethylamino)benzophenone about 3% weight relative to the mass of acrylates), exposed at 365 nm for increasing time periods: 0 s, 1, 10, and 20 minutes respectively.
Figure 4:
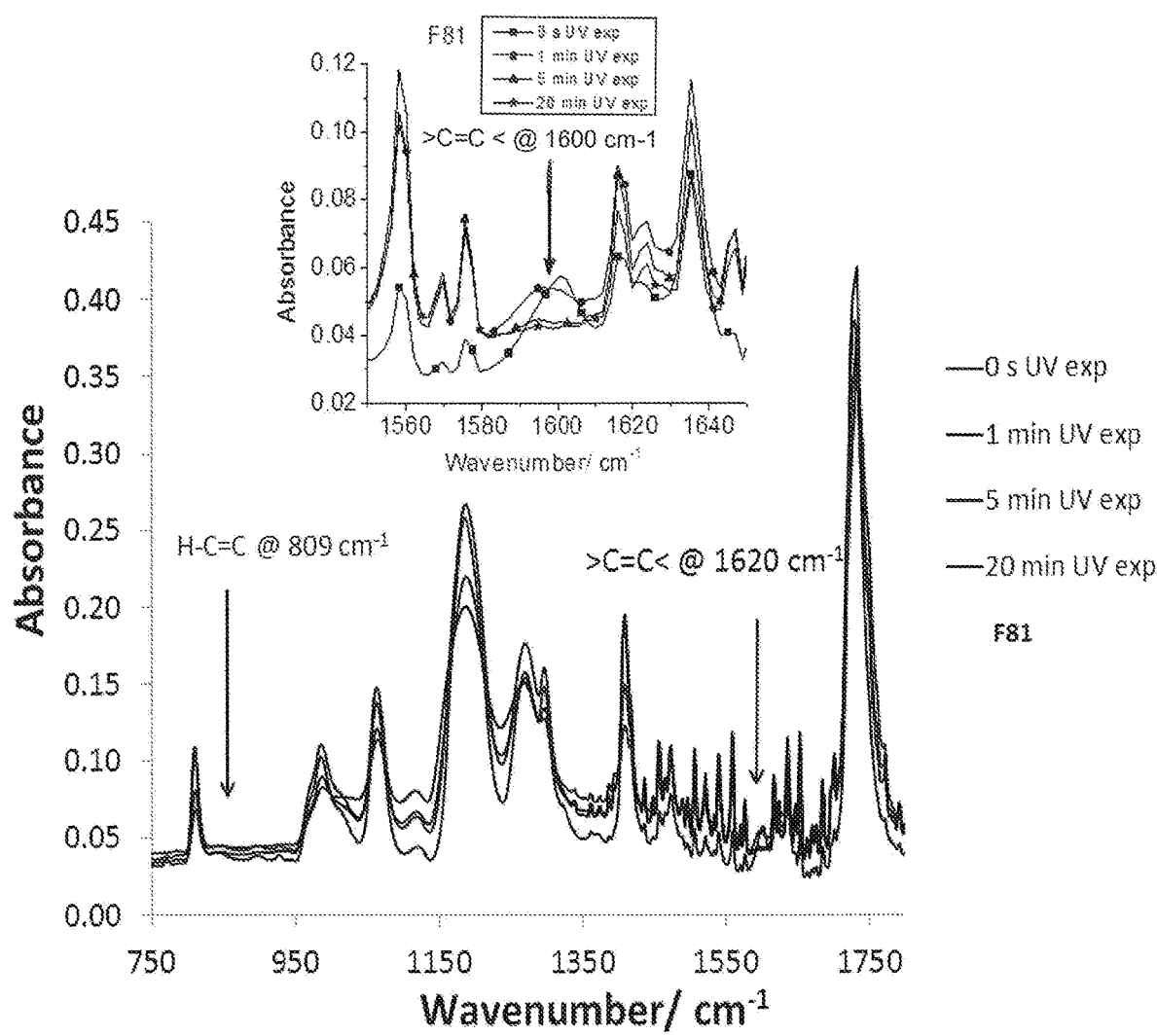
FIG. 4 is a graphical representation of a FTIR spectra of a formulation made from 1.240 g pentaerythritol triacrylate (PETTA), 5.011 g isobutyl acrylate, and 0.178 g Michler's ketone, following UV exposure for 0 s, 1 min, 5 min, and 20 min.

The following description is of illustrative embodiments by way of example only and without limitation to the combination of features necessary for carrying the invention into effect.

Unless defined otherwise, all technical and scientific terms used herein have the same meaning as commonly understood by one of ordinary skill in the art to which this invention belongs. It must also be noted that, as used in the specification and the appended claims, the singular forms "a," "an" and "the" include plural referents unless the context clearly dictates otherwise.

The polymer formulation described herein is capable of being cured under ultra-violet (UV) light under open air using free radical polymerization, and which may be used to manufacture various electronic components such as capacitors, transistors, and the like. The resulting films of dielectric are cured more rapidly than other reported methods for crosslinked polymer dielectrics, and are insoluble in common solvents for conductive inks, such as water, alcohols, or even acetone.

The radiation curable polymer formulations are made up of an acrylic monomer, a cross linking agent, and a photoinitiator. The acrylate monomer should be miscible with the cross linking agent, and the photoinitiator should be soluble in the mixture of acrylates. Since oxygen is a known inhibitor of radical polymerization and an efficient quencher of excited states of photoinitiators, some of the crosslinking agents used in the present formulation have a higher molecular weight and viscosity, thus lowering the refresh rate of oxygen in the reaction mixture. This in turn allows the polymerization to start after an initial lag due to consumption of molecular oxygen by the in-situ generated free radicals.

Suitable acrylate monomers for use in the radiation curable polymer formulation are shown in Table 1.

TABLE 1

Acrylate monomers

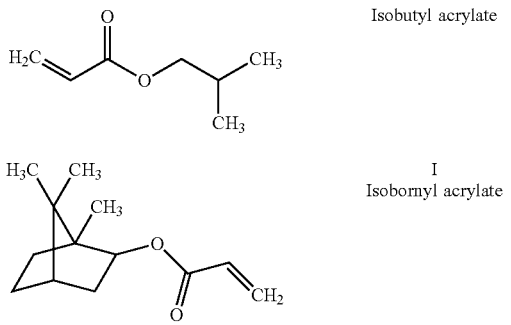

Isobutyl acrylate

I
Isobornyl acrylate

TABLE 1-continued

Acrylate monomers

Hexyl acrylate

Butyl methacrylate

Butyl acrylate

2-Ethylhexyl acrylate

2-Hydroxyethyl acrylate tert-Butyl acrylate

Cross linking agents for use in the present formulation should preferably have a higher molecular weight and viscosity. Suitable cross linking agents are compounds shown in Table 2. These cross linking agents include: glycerol 1,3-diglycerolate diacrylate (GDGDA), 1,6-Hexanediol diacrylate, 1,6-Hexanediol dimethacrylate, trimethylolpropane triacrylate, pentaerythritol triacrylate, pentaerythritol tetraacrylate, di(trimethylolpropane) tetraacrylate or trimethylolpropane propoxylate triacrylate.

TABLE 2

Cross linking agents

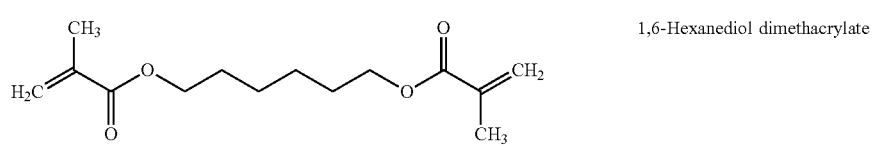

1,6-Hexanediol diacrylate 1,6-Hexanediol dimethacrylate

TABLE 2-continued

| Cross linking agents | |
|---|---|
| (structure) | Trimethylolpropane triacrylate |
| (structure) | Pentaerythritol triacrylate |
| (structure) | Pentaerythritol tetraacrylate |
| (structure) | Di(trimethylolpropane) tetraacrylate |
| (structure) | Trimethylolpropane propoxylate triacrylate |
| (structure) | Glycerol 1,3-diglycerolate diacrylate |

As for the photoinitiators useful in the present formulation, both 4,4'-bis(dimethylamino)benzophenone (also known as Michler's ketone) and 9,10-phenanthrenequinone were shown to be effective (Table 3); other photoinitiators soluble in the acrylates mixtures may be used, provided that they are photosensitized by the UV radiation and are capable of initiating the free radical polymerization and cross-linking reactions.

TABLE 3

Photoinitiators

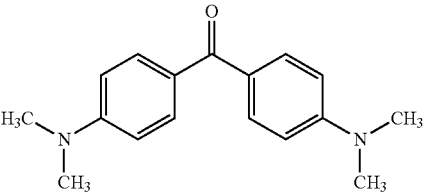

4,4'-Bis(dimethylamino)benzophenone (Michler's ketone)

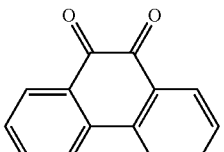

9,10-Phenanthrenequinone

The ratio of the three components may be varied. For example, glycerol 1,3-diglycerolate diacrylate has a high viscosity, while isobutyl acrylate has a much lower viscosity. Therefore, it is possible to prepare formulations with various viscosities by altering the ratio of the two acrylates. The crosslinking agent has a predominant hydrophilic character due to the three functional —OH groups, therefore the concentration of the crosslinking agent influences the surface energy of the dielectric film. As such, a formulation containing 1-99% glycerol 1,3-diglycerolate diacrylate, 99-1% isobutyl acrylate may be prepared. The loading of the photoinitiator 4,4'-bis(dimethylamino)benzophenone or 9,10-phenanthrenequinone may be varied between 0.1% to 20%, more specifically 0.1 to 5%.

As shown in FIG. 1, a typical thin film transistor (1) includes: a substrate (2); a gate (3); a gate dielectric (4); semiconductor (5); source (6); and drain (7). The formulations described herein can act as a gate dielectric (4) in such a thin film transistor. The actual components used in the manufacture of the thin film transistor (1) would be chosen based on the application, and would be known in the art. For example, poly(ethyleneterephthalate) (PET) foils are common substrates for printable electronics and silver is commonly used as a gate in such an application.

In a bottom-gate thin film transistor architecture, the formulations described herein are typically deposited on the substrate after the gate material has been adhered to the substrate. In top-gate architecture, the formulations described herein are deposited after the semiconductor material has been applied on S/D electrodes and prior to deposition of the G electrode. Substrates for use with the formulations include, flexible or rigid substrates. Rigid substrates can include, but are not limited to, Si wafers, glass, ceramic, and quartz. Once the formulation has been applied, the formulation coated substrate is exposed to ultraviolet light for a period of time. The curing times can vary since the polymerization degree improves with exposure time, intensity of the UV radiation, and increased concentration of the photoinitiator.

Example 1

The following formulations were spin coated on top of Si wafers at 2500 rpm for 30 s, and tested for photopolymerization under open air in clean room atmosphere by exposing for various time intervals to UV radiation centred at 365 nm inside an AB-M mask aligner, 58 mW/cm$^2$:

F1: glycerol 1,3-diglycerolate diacrylate:isobutyl acrylate=80:20 weight ratio, photoinitiator Michler's ketone 1% weight relative to the mass of acrylates; UV exposure for 30 s—cured, but not hard, 2 min—cured, hard film, and 4 min—cured, hard film; after 24 h the films were washed with acetone, ethanol, and methanol and were not removed even when mechanical abrasion/rubbing with a paper towel was performed.

F3: glycerol 1,3-diglycerolate diacrylate:isobutyl acrylate=20:80 weight ratio, photoinitiator Michler's ketone 1% weight relative to the mass of acrylates; UV exposure for 30 s, 2 min and 4 min led to all films being cured and hard, difficult to scratch; the films were thinner than when 80% wt glycerol 1,3-diglycerolate diacrylate was used as crosslinking agents, allowing therefore to tune the thickness by changing the ratio of the two acrylates, i.e. monomer and cross-linking agent.

Example 2

Formulation 1 (F1) was spin coated on top of a glass substrate at 7000 rpm for 60 s and UV cured inside the AB-M mask aligner for 4 min at 365 nm (58 mW/cm$^2$) gave ~5.4 μm thick films. The thick films are obtained because of the high viscosity of the crosslinking agent glycerol 1,3-diglycerolate diacrylate. Thinner films were obtained by reducing the % of glycerol 1,3-diglycerolate diacrylate or by diluting the acrylates formulations with isopropanol (IPA). For example, a formulation containing 20% glycerol 1,3-diglycerolate diacrylate, 80% isobutyl acrylate and 1% Michler's ketone relative to the mass of acrylates gave films with the following thicknesses when spin coated: 550 nm at 9000 rpm, 800 nm at 5000 rpm and 830 nm at 3000 rpm.

Thinner films of a formulation containing 80% glycerol 1,3-diglycerolate diacrylate, 20% isobutyl acrylate and 1% weight Michler's ketone were obtained by diluting it with various amounts of a compatible organic solvent, for example isopropanol (IPA).

The films were UV cured and hardened, with most of IPA released during the spin coating process. This method proves that one may obtain thinner films starting with a more viscous acrylates formulation and using the appropriate solvent for dilution.

Example 3

In another set of experiments, the following formulations were prepared, spin coated on top of Si wafers at 3000 rpm for 60 s and exposed to UV radiation centred at 365 nm inside an AB-M mask aligner for 4 minutes, 58 mW/cm$^2$:

F10: glycerol 1,3-diglycerolate diacrylate:isobutyl acrylate=50:50 wt ratio, photoinitiator 9,10-Phenanthrenequinone 1% wt relative to acrylates mass; cured, hard uniform film.

F11: glycerol 1,3-diglycerolate diacrylate:isobutyl acrylate=50:50 wt ratio, photoinitiator Michler's ketone 1% wt relative to mass of acrylates; cured, hard uniform film.

Example 4

Capacitors were prepared by spin coating an acrylate formulation containing glycerol 1,3-diglycerolate diacrylate:isobutyl acrylate=80:20 weight ratio, photoinitiator Michler's ketone 3% weight relative to the mass of acrylates on top of ITO coated glass substrates, and UV cured them for 10 and 20 minutes. The top Al electrode was evaporated through a shadow mask, and the capacitors were characterized and the capacitance recorded by sweeping a potential between −10.0 to +10.0 V at frequencies between 100 Hz to 1.0 MHz. The calculated values of the dielectric constant are reported in Table 4.

TABLE 4

Dielectric constant as a function of frequency for acrylate dielectrics containing 3% photoinitiator Michler's ketone (MK), and exposed to UV radiation for 10 and 20 minutes respectively.

| Frequency (Hz) | Dielectric constant 20 min UV | Dielectric constant 10 min UV |
|---|---|---|
| 100 | 5.61 | 5.7 |
| 1000 | 5.5 | 5.64 |
| 10000 | 5.35 | 5.4 |
| 100000 | 5.12 | 5.24 |
| 1000000 | 4.8 | 4.25 |

Example 5

Other formulations were developed and tested:

F81—pentaerythritol triacrylate (PETTA) 1.240 g, isobutyl acrylate 5.011 g, and Michler's ketone 0.178 g.

F82—di(trimethylolpropane) tetraacrylate (DTMPTA) 1.132 g, isobutyl acrylate 4.542 g, and Michler's ketone 0.172 g.

F83—pentaerythritol tetraacrylate (PETA) 2.314 g, isobutyl acrylate 8.904 g, and Michler's ketone 0.328 g.

The formulations contain ~3.0% wt photoinitiator Michler's ketone relative to the mass of acrylates. These formulations were stirred overnight, and then sonicated for 60 min. They were filtered through 0.45 um PTFE filter, and spin-coated at 1500 rpm for 60 s on top of glass substrates, followed by exposure for 1 min, 3 min and 6 min at 365 nm with AB-M mask aligner. The films were inspected visually, tested for hardness by smearing/scratch test and then were washed with organic solvents—first with isopropyl alcohol (IPA) and then with acetone; the films were not dissolved by the organic solvents, showing that crosslinking had occurred.

The surface of the films and the roughness were characterized with Zygo optical profilometry and optical microscopy and the films were found to be uniform and smooth, with roughness on the order of a few nm.

Example 6

Formulations F81-F83 were spin coated on top of clean Si wafer substrates at 1500 rpm for 60 s, and then exposed to increasing UV exposure time (0 s, 1 min, 5 min and 20 min) under open air. The films were then analyzed with FTIR spectroscopy to monitor the degree of polymerization/crosslinking.

Figure 5:
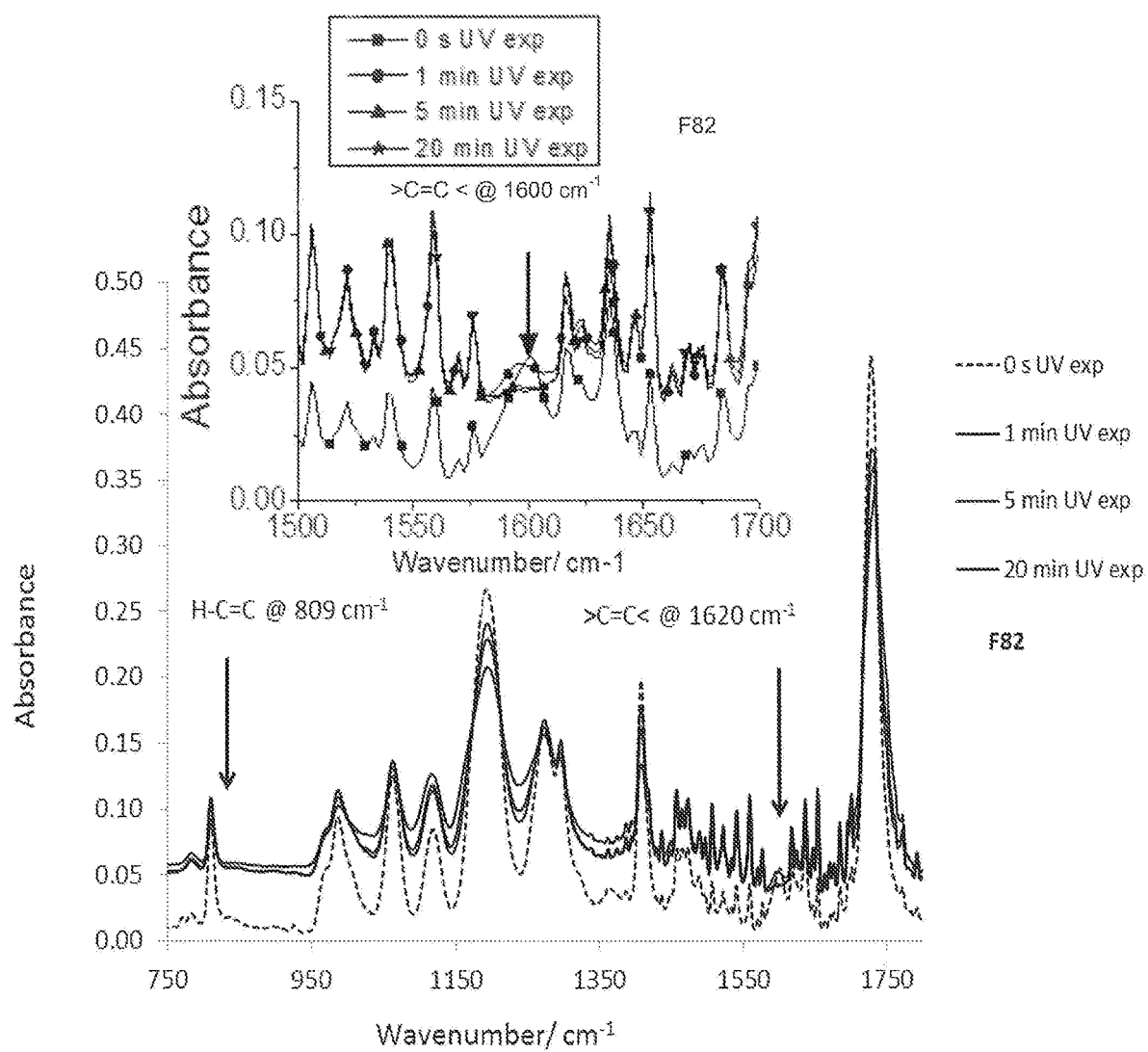
FIG. 5 is a graphical representation of a FTIR spectra of the formulation made from 1.132 g di(trimethylolpropane) tetraacrylate (DTMPTA), 4.542 g isobutyl acrylate, and 0.172 g Michler's ketone following UV exposure for 0 s, 1 min, 5 min, and 20 min.
Figure 6:
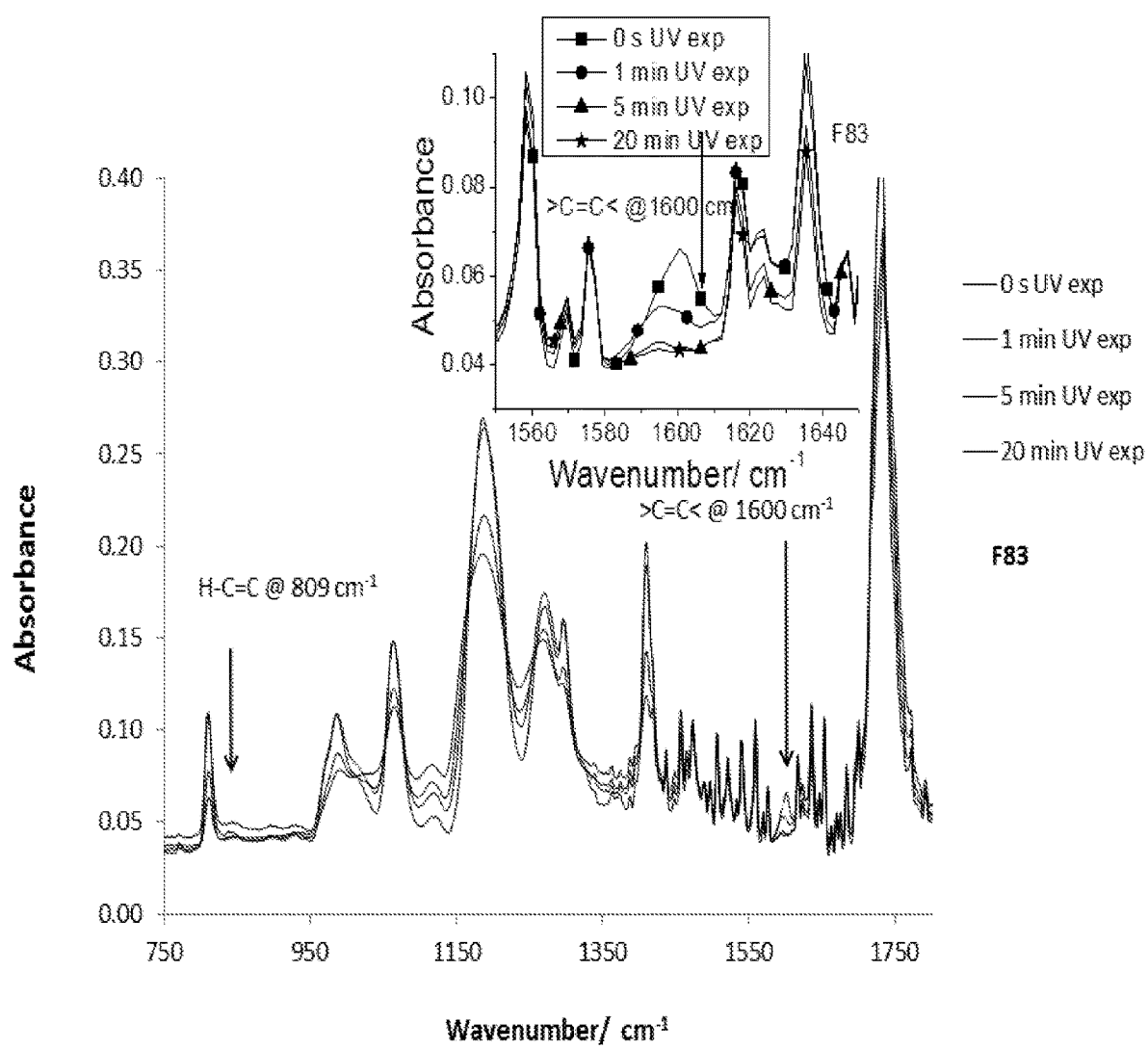
FIG. 6 is a graphical representation of a FTIR spectra of the formulation made from 2.314 g pentaerythritol tetraacrylate (PETA), 8.904 g isobutyl acrylate, and 0.328 g Michler's ketone following UV exposure for 0 s, 1 min, 5 min, and 20 min.

Acrylates have a signature spectrum, with bands at 1620 cm$^{-1}$ assigned to >C=C< stretch and 809 cm$^{-1}$ to the C—H bond adjacent to the C=C double bond, H—C=C. Therefore by monitoring the absorption at 1620 cm$^{-1}$ and 809 cm$^{-1}$ one can have a clue of the disappearance of the C=C double bond as the polymerization reaction progresses, as shown in FIG. 5 and FIG. 6.

The capacitance of capacitors made of F82 and F83 and extracted dielectric constants for the two formulations are shown in Tables 5 and 6.

TABLE 5

Capacitance of the capacitors made with F82 and the extracted dielectric constants for F82

| Frequency (Hz) | Capacitance (nF) | Dielectric constant |
|---|---|---|
| 100 | 0.6553 | 4.25 |
| 1000 | 0.6214 | 4.03 |
| 1 × 10$^4$ | 0.5880 | 3.82 |
| 1 × 10$^5$ | 0.5613 | 3.64 |
| 1 × 10$^6$ | 0.5509 | 3.56 |

TABLE 6

Capacitance of the capacitors made with F83 and the extracted dielectric constants for F83

| Frequency (Hz) | Capacitance (nF) | Dielectric constant |
|---|---|---|
| 100 | 0.6753 | 4.05 |
| 1000 | 0.6647 | 4.00 |
| 1 × 10$^4$ | 0.6508 | 3.90 |
| 1 × 10$^5$ | 0.6370 | 3.82 |
| 1 × 10$^6$ | 0.6330 | 3.80 |

Example 7

Another formulation was developed and tested:

F79—trimethylolpropane triacrylate (TMPTA) 0.900 g, isobutyl acrylate (iButA) 3.640 g, and Michler's ketone 0.116 g.

Figure 7:
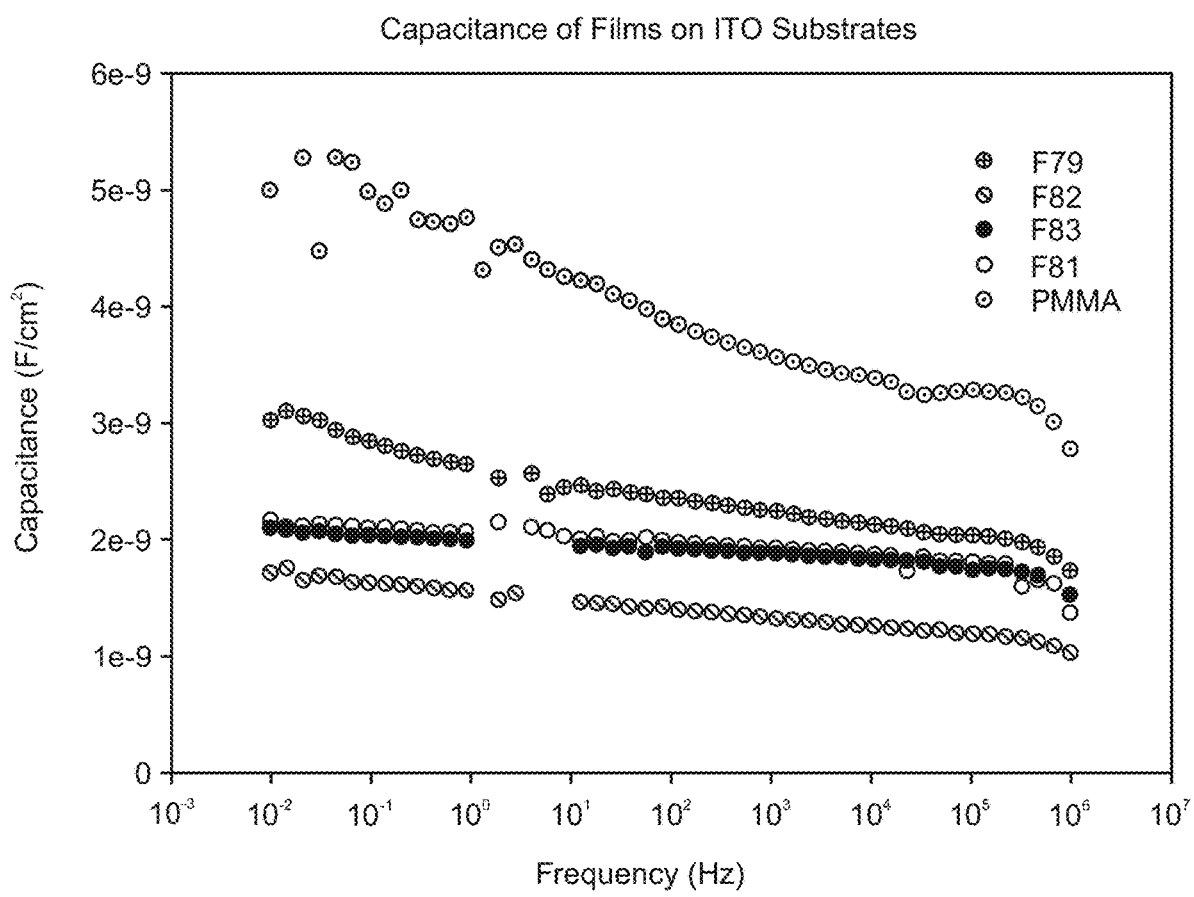
FIG. 7 is a graphical representation of frequency-dependent capacitance of 0.16 cm$^2$ (0.4 cm×0.4 cm) films of various dielectric polymers deposited on indium tin oxide (ITO) substrates; and, FIG. 8 is an optical microscopy image of an all flexoprinted transistor fabricated from a UV curable acrylate ink (containing 3.015 g glycerol 1,3-diglycerolate diacrylate (GDGDA), 0.670 g isobutyl acrylate (iButA), 107 mg Michler's ketone and 6.227 g 1-pentanol).

Capacitors were prepared by spin coating films of acrylate formulations F79, F81, F82 and F83, as well as a formulation based on a commercially available acrylate (poly(methyl methacrylate) (PMMA)), on top of indium tin oxide (ITO) coated glass substrates, followed by UV curing for 10 minutes at room temperature. A top Al electrode was evaporated through a shadow mask, and the capacitors were characterized by recording capacitance by sweeping a potential from −10.0 to +10.0 V at frequencies between 0.001 Hz and 10 MHz. FIG. 7 depicts the capacitance of the films on the ITO substrates.

FIG. 7 illustrates a capacitance increase for F81 and F83 of about 20% from 1 MHz to 10 mHz, a slightly larger capacitance increase of about 35% for F79 and F82 over the same frequency range, and a larger capacitance increase of about 40% for the PMMA formulation over the same frequency range. The results indicate that films of the present invention demonstrate less variation in capacitance as a function of frequency than the formulation based on commercially available PMMA. The thickness of the PMMA film was 450 nm, while for F79-F83 the thickness was in the range 750 nm to 800 nm.

Example 8

A UV curable dielectric ink formulation of the present invention was used to prepare an all flexo-printed thin film transistor (TFT) in roll-to-roll lines. The formulation comprised 3.015 g glycerol 1,3-diglycerolate diacrylate (GDGDA), 0.670 g isobutyl acrylate (iButA), 107 mg Michler's ketone and 6.227 g 1-pentanol. The ink was sonicated for 30 minutes, then filtered through a 0.22 micron polyethersulfone (PES) filter.

Roll-to-roll flexographic printing was performed as follows. First, a bottom gate (G) was flexo printed on top of a 120 micron thick poly(ethylene terephthalate) (PET) foil (21 cm×16 cm) with a Testacolor™ flexographic printer using a silver nanoparticles ink suitable for flexography. After the silver metal ink was sintered inside an oven at 130° C. for 45 minutes, two layers of the UV curable dielectric ink were flexo printed with a 5.0 mL/m² anilox roll. After the first layer was printed, it was exposed to UV radiation (74 mW/cm²) centered at 365 nm for 120 s, followed by a 2 min air plasma treatment prior to depositing the second layer of dielectric by flexography. After the second layer the substrate was again subjected to UV curing for 120 s, and the recorded thickness of the crosslinked polymer dielectric was 1.20 µm. Source-drain (S/D) electrodes were then deposited by flexography (with a 3.0 mL/m² anilox roll) using the same ink employed for deposition of the bottom gate (G). The films were baked at 100° C. on top of a hot plate for 2 minutes prior to sintering at 130° C. for 1 h inside an oven. The last material deposited on top of S/D electrodes was the organic semiconductor (OSC) Lisicon™ SP300 (from Merck). For the deposition of the OSC an 8.0 mL/m² anilox roll was used, and the samples were thermally treated at 100° C. for 20 minutes inside an oven.

Figure 8:
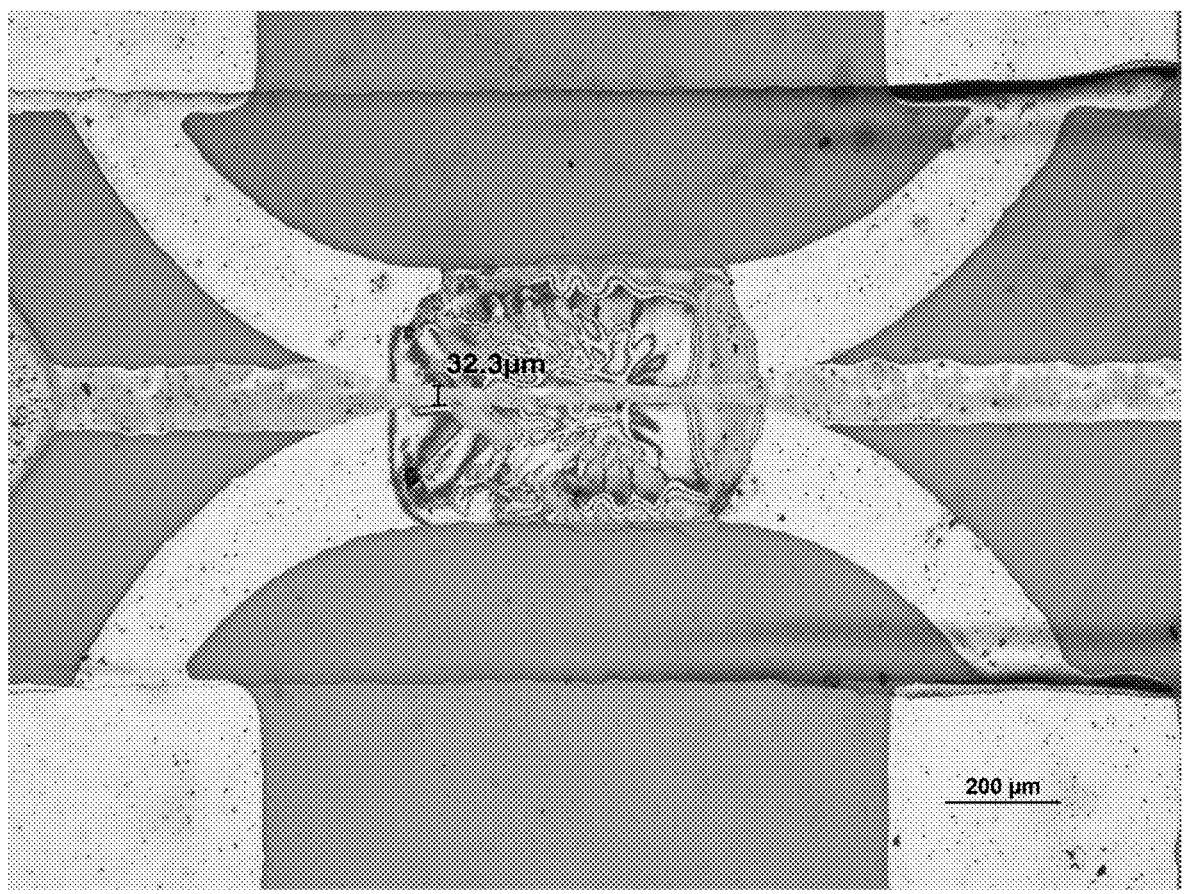

Optical microscopy was used to study the TFT, and the microscope image is shown in FIG. 8. The dielectric film in FIG. 8 is smooth and free of pinholes, and has a channel length of about 32 µm.

The novel features will become apparent to those of skill in the art upon examination of the description. It should be understood, however, that the scope of the claims should not be limited by the embodiments, but should be given the broadest interpretation consistent with the wording of the claims and the specification as a whole.

We claim:

1. A thin film transistor gate dielectric comprising a radiation curable polymer formulation comprising:
   an acrylic monomer;
   a cross linking agent; and
   a photoinitiator,
   wherein the cured polymer is insoluble in an organic solvent.

2. The thin film transistor gate dielectric of claim 1, wherein the organic solvent is isopropanol, acetone, ethanol, methanol, other alcohols, ketones, polar and non-polar organic solvents or combinations thereof.

3. The thin film transistor gate dielectric of claim 1, wherein the cured polymer is insoluble in an aqueous solvent.

4. The thin film transistor gate dielectric of claim 1, wherein the cured polymer has a dielectric constant greater than 3.8.

5. The thin film transistor gate dielectric of claim 1, wherein the acrylic monomer is isobutyl acrylate, tert-butyl acrylate, butyl acrylate, butyl methacrylate, isobornyl acrylate, hexyl acrylate, 2-ethylhexyl acrylate or 2-hydroxyethyl acrylate.

6. The thin film transistor gate dielectric of claim 1, wherein the cross linking agent is glycerol 1,3-diglycerolate diacrylate, 1,6-hexanediol diacrylate, 1,6-hexanediol dimethacrylate, trimethylolpropane triacrylate, pentaerythritol triacrylate, pentaerythritol tetraacrylate, di(trimethylolpropane) tetraacrylate or trimethylolpropane propoxylate triacrylate.

7. The thin film transistor gate dielectric of claim 1, wherein the photoinitiator is 4,4'-bis(dimethylamino)benzophenone or 9,10-phenanthrenequinone.

8. The thin film transistor gate dielectric of claim 1, wherein the acrylic monomer is isobutyl acrylate; the cross linking agent is glycerol 1,3-diglycerolate diacrylate, trimethylolpropane triacrylate, pentaerythritol triacrylate, pentaerythritol tetraacrylate or di(trimethylolpropane) tetraacrylate; and the photoinitiator is 4,4'-bis(dimethylamino)benzophenone.

9. The thin film transistor gate dielectric of claim 1, wherein the photoinitiator is provided at a concentration of about 1 to about 3% weight relative to the acrylates mass.

10. The thin film transistor gate dielectric of claim 1 comprising about 1 to about 99% (w/w) glycerol 1,3-diglycerolate diacrylate, about 99% to about 1% (w/w) isobutyl acrylate and about 0.1% to about 20% weight relative to acrylates mass of 4,4' is(dimethylamino)benzophenone.

11. The thin film transistor gate dielectric of claim 1 comprising about 1 to about 99% (w/w) glycerol 1,3-diglycerolate diacrylate, about 99% to about 1% (w/w) isobutyl acrylate and about 0.1% to about 20% weight relative to acrylates mass of 9,10-henanthrenequinone.

12. The thin film transistor gate dielectric of claim 1 comprising about 1 to about 99% (w/w) trimethylolpropane triacrylate, about 99% to about 1% (w/w) isobutyl acrylate and about 0.1% to about 20% weight relative to acrylates mass of 4,4'-bis(dimethylamino)benzophenone.

13. The thin film transistor gate dielectric of claim 1 comprising about 1 to about 99% (w/w) pentaerythritol tetraacrylate, about 99% to about 1% (w/w) isobutyl acrylate and about 0.1% to about 20% weight relative to acrylates mass of 4,4'-bis(dimethylamino)benzophenone.

14. The thin film transistor gate dielectric of claim 1 comprising about 1 to about 99% (w/w) di(trimethylolpropane) tetraacrylate, about 99% to about 1% (w/w) isobutyl acrylate and about 0.1% to about 20% weight relative to acrylates mass of 4,4'-bis(dimethylamino)benzophenone.

15. The thin film transistor gate dielectric of claim 1 comprising about 1 to about 99% (w/w) pentaerythritol triacrylate, about 99% to about 1% (w/w) isobutyl acrylate and about 0.1% to about 20% weight relative to acrylates mass of 4,4'-bis(dimethylamino)benzophenone.

16. A method for producing a thin film transistor gate dielectric comprising the steps of:
   preparing a polymer formulation comprising an acrylic monomer, a cross linking agent, and a photoinitiator;
   applying the polymer formulation to a substrate; and
   curing the polymer formulation by exposing the coated substrate to UV radiation in an open air atmosphere.

17. The method of claim 16, wherein the polymer formulation is the radiation curable polymer formulation as defined in claim 1.

18. The method of claim 16, wherein the step of applying comprises spin coating the polymer formulation to the substrate, screen printing, inkjet printing, flexography printing, gravure printing, off-set printing, airbrushing, aerosol printing or typesetting.

19. The thin film transistor gate dielectric of claim 1, wherein the formulation has been cured to form a polymer.

* * * * *